United States Patent
Li (10) Patent No.: US 10,691,532 B2
(45) Date of Patent: Jun. 23, 2020

(54) STORAGE DRIVE ERROR-CORRECTING CODE-ASSISTED SCRUBBING FOR DYNAMIC RANDOM-ACCESS MEMORY RETENTION TIME HANDLING

(71) Applicant: Alibaba Group Holding Limited, Grand Cayman (KY)

(72) Inventor: Shu Li, Santa Clara, CA (US)

(73) Assignee: ALIBABA GROUP HOLDING LIMITED, Grand Cayman (KY)

( * ) Notice: Subject to any disclaimer, the term of this patent is extended or adjusted under 35 U.S.C. 154(b) by 5 days.

(21) Appl. No.: 16/024,372

(22) Filed: Jun. 29, 2018

(65) Prior Publication Data

US 2020/0004624 A1    Jan. 2, 2020

(51) Int. Cl.
| | |
|---|---|
| G11C 29/00 | (2006.01) |
| G06F 11/10 | (2006.01) |
| H03M 13/11 | (2006.01) |
| H03M 13/15 | (2006.01) |
| G11C 29/52 | (2006.01) |

(52) U.S. Cl.
CPC ........ G06F 11/106 (2013.01); G06F 11/1068 (2013.01); G11C 29/52 (2013.01); H03M 13/1174 (2013.01); H03M 13/152 (2013.01)

(58) Field of Classification Search
CPC .............. G06F 11/106; G06F 11/1068; H03M 13/1174; H03M 13/152; G11C 29/52
See application file for complete search history.

(56) References Cited

U.S. PATENT DOCUMENTS

| | | |
|---|---|---|
| 5,657,332 A | 8/1997 | Auclair et al. |
| 7,275,130 B2 | 9/2007 | Klein |
| 7,275,200 B2 | 9/2007 | Leung |
| 7,392,456 B2 | 6/2008 | Leung et al. |
| 7,526,713 B2 | 4/2009 | Klein |
| 7,558,142 B2 | 7/2009 | Klein |
| 8,050,095 B2 | 11/2011 | Gonzalez et al. |
| 8,386,886 B2 | 2/2013 | Ito et al. |
| 9,170,879 B2 | 10/2015 | Yang |
| 2003/0097608 A1* | 5/2003 | Rodeheffer ........... G06F 11/106 714/6.2 |
| 2005/0249010 A1 | 11/2005 | Klein |
| 2008/0072120 A1* | 3/2008 | Radke ................. G06F 11/1068 714/768 |
| 2013/0166988 A1* | 6/2013 | Sharon ................ G06F 11/1012 714/758 |
| 2013/0326263 A1* | 12/2013 | Alameldeen ........ G06F 11/1048 714/6.2 |
| 2014/0047305 A1 | 2/2014 | Pawlowski et al. |

* cited by examiner

*Primary Examiner* — Samir W Rizk
(74) *Attorney, Agent, or Firm* — James J. DeCarlo; Greenberg Traurig, LLP (57) ABSTRACT

Systems, devices, and methods for providing ECC-assisted scrubbing of memory devices and error correction of memory devices. In one embodiment, a method is disclosed comprising obtaining, at a storage device, data and a first parity portion to write to a memory device, the first parity portion generated via a first encoding; encoding, at the storage device, the data with a second encoding to generate a second parity portion; aligning, by the storage device, the data, the first parity portion, and the second parity portion according to a predefined alignment scheme, the aligning generating aligned data; and writing, by the storage device, the aligned data to the memory device.

16 Claims, 8 Drawing Sheets

STORAGE DRIVE ERROR-CORRECTING CODE-ASSISTED SCRUBBING FOR DYNAMIC RANDOM-ACCESS MEMORY RETENTION TIME HANDLING

COPYRIGHT NOTICE

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

The disclosed embodiments relate to the field of memory management and, specifically, to techniques for providing enhanced error correction of memory devices.

Variable retention time (VRT) of dynamic random-access memory (DRAM) devices drastically affects the scalability of such devices. VRT refers to the variable length of time in which a given DRAM cell can retain its value. This retention time varies during runtime. Thus, a given DRAM cell cannot be presumed to maintain a constant value during runtime. Additionally, the length of time that the same DRAM cell retains its value cannot be presumed. The problems of VRT continue to increase as the feature size (i.e., transistor size) of DRAM is reduced.

Various techniques have been implemented to address this deficiency. The primary technique in use by current systems is to refresh the contents of memory periodically. Periodically, a DRAM device will read its contents and write the data back to the cells (referred to as "refreshing"). In some devices, before writing back the data, errors may be corrected using an error-correcting code (ECC) (referred to as "scrubbing"). The period in which refreshing or scrubbing is performed can be fixed or may be determined dynamically based on observing the characteristics of the memory.

While the above refreshing and scrubbing system overcomes the problems of VRT, it introduces additional negative side effects. First, more frequent refreshes/scrubs reduce the throughput of the memory device and increase the power consumption of the memory device. Second, refreshing maintains erroneous data. If the data read during a refresh is already corrupted, the refresh procedure will simply persist the corrupted data. Further, during scrubbing, if multiple errors exist, only one may be corrected resulting in an uncorrectable error and system failure. Third, while scrubbing can generally correct one error, uncorrectable errors (i.e., more than one error) are becoming more critical due to the heavy use of memory in many systems (especially in server-based systems).

Thus, there exists a need in the state of the art to overcome the problem of VRT in memory devices while reducing or eliminating the deficiencies of existing refreshing/scrubbing techniques.

BRIEF SUMMARY

To remedy the above deficiencies, the disclosed embodiments describe systems, methods, and devices for providing stronger error correction of memory devices by leveraging ECC encoders/decoders existing on peripheral devices.

In one embodiment, a method is disclosed comprising obtaining, at a storage device, data and a first parity portion to write to a memory device, the first parity portion generated via a first encoding; encoding, at the storage device, the data with a second encoding to generate a second parity portion; aligning, by the storage device, the data, the first parity portion, and the second parity portion according to a predefined alignment scheme, the aligning generating aligned data; and writing, by the storage device, the aligned data to the memory device.

In another embodiment, a method is disclosed comprising decoding, by a storage device from a memory, a memory region using a first decoding in response to a read command; detecting, by the storage device, that the decoding using the first decoding failed; decoding, by the storage device, the memory region using a second decoding to generate a codeword; writing, by the storage device, the codeword to the memory; and returning, by the storage device, the codeword to a device that issued the read command.

In another embodiment, a device is disclosed comprising a processor; and a storage medium for tangibly storing thereon program logic for execution by the processor, the stored program logic comprising: logic, executed by the processor, for obtaining data and a first parity portion to write to a memory device, the first parity portion generated via a first encoding; encoding the data with a second encoding, the encoding the data using the second encoding generating a second parity portion; aligning the data, the first parity portion, and the second parity portion according to a predefined alignment scheme, the aligning generating aligned data; and writing the aligned data to the memory device.

In another embodiment, a device is disclosed comprising a processor; and a storage medium for tangibly storing thereon program logic for execution by the processor, the stored program logic comprising: logic, executed by the processor, for decoding, from a memory, a memory region using a first decoding in response to a read command, logic, executed by the processor, for detecting that the decoding using the first decoding failed, logic, executed by the processor, for decoding the memory region using a second decoding to generate a codeword, logic, executed by the processor, for writing the codeword to the memory, and logic, executed by the processor, for returning the codeword to a device that issued the read command.

In another embodiment, a system is disclosed comprising a memory, the memory configured to encode and decode data using a first encoding; and at least one storage device, the at least one storage device configured to: encode data written to memory using an error-correcting code (ECC) after receiving data from the memory encoded using the first encoding, and decode data read from memory using the ECC after detecting an error in decoding the data using the first encoding and write corrected data to the memory after decoding.

The disclosed embodiments solve the above-described problems with variable retention time of DRAM at system level through the storage drive ECC assistance to periodically remove noise in the batch mode. The strong ECC existing in storage drives collaborates with the hamming code of DIMM to form the two-fold protection. The robustness and efficiency of DRAM is significantly improved with the cost reduction in the field of power, bandwidth, etc.

BRIEF DESCRIPTION OF THE DRAWINGS

The preceding and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

The present disclosure will now be described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general-purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

These computer program instructions can be provided to a processor of: a general purpose computer to alter its function to a special purpose; a special purpose computer; ASIC; or other programmable digital data processing apparatus, such that the instructions, which execute via the processor of the computer or other programmable data processing apparatus, implement the functions/acts specified in the block diagrams or operational block or blocks, thereby transforming their functionality in accordance with embodiments herein.

For the purposes of this disclosure a computer-readable medium (or computer-readable storage medium/media) stores computer data, which data can include computer program code (or computer-executable instructions) that is executable by a computer, in machine-readable form. By way of example, and not limitation, a computer-readable medium may comprise computer-readable storage media, for tangible or fixed storage of data, or communication media for transient interpretation of code-containing signals. Computer-readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer-readable storage media includes, but is not limited to, RAM, ROM, EPROM, EEPROM, flash memory or other solid-state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

Figure 1:
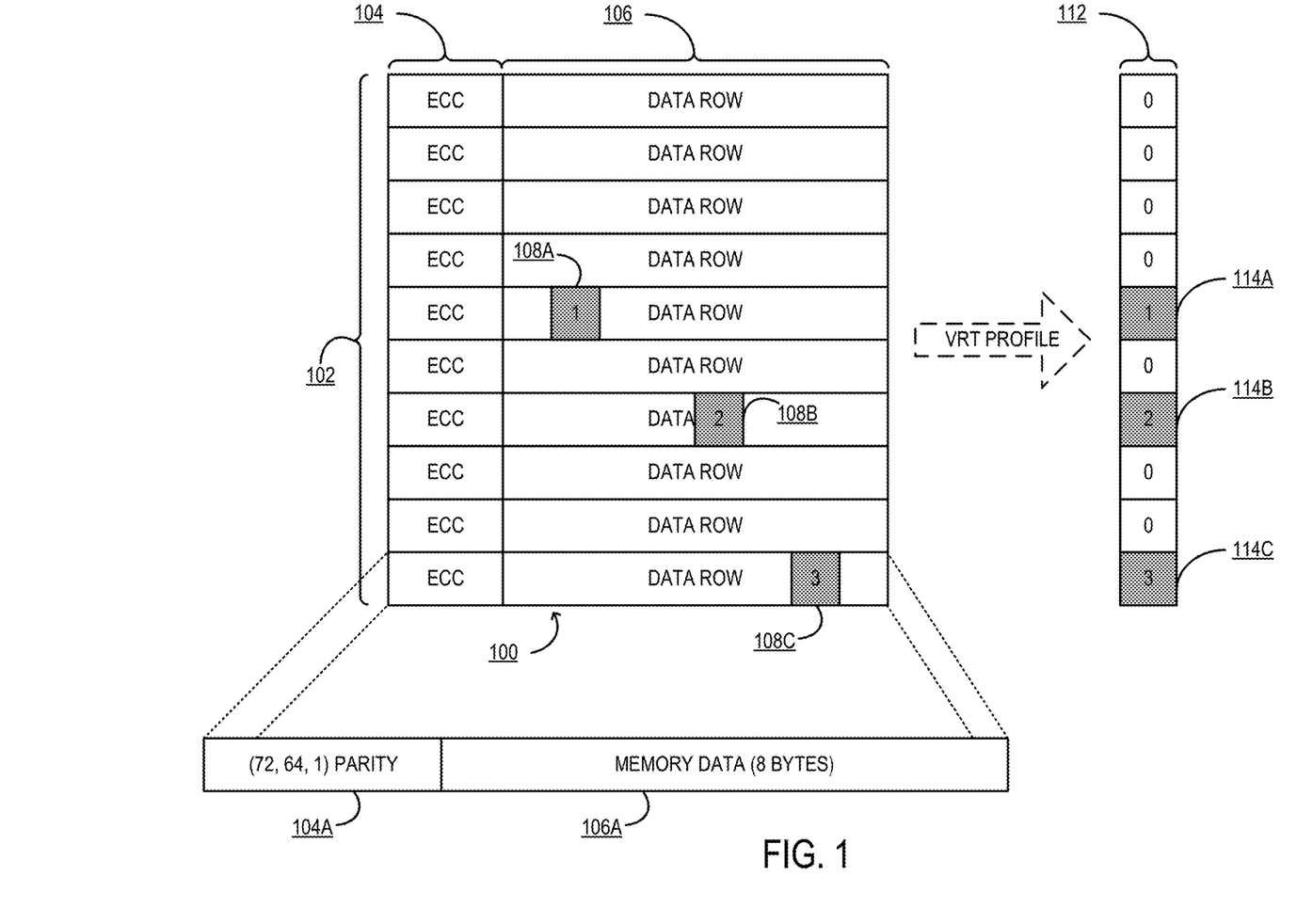
FIG. 1 is a block diagram illustrating a high-frequency refresh table according to one embodiment.

FIG. 1 is a block diagram illustrating a high-frequency refresh table according to one embodiment.

In the illustrated embodiment, a memory (100) includes multiple rows (102). In the illustrated embodiment, the memory (100) comprises a DRAM memory and, in this embodiment, each row comprises a word line of transistors.

The illustrated ECC and data portions of a given row are utilized to illustrate logic divisions of the word line.

In the illustrated embodiment, each word line includes an ECC portion (104) and a data row (106). In the illustrated embodiment, data row comprises user data written to the memory (100) and may comprise any data representable by the memory (e.g., system data, user data, processes, etc.). ECC portion (104) comprises one or more bits prepended (or, in alternative embodiments, appended) to the data row (106) and utilized for error correction. In the illustrated embodiment, the ECC portion (104) is generated automatically by the memory (100). For example, the memory (100) may include an additional encoder/decoder for generating the ECC portion (104) during writes/reads, respectively.

The enlargement (104A, 106A) illustrates an exemplary type of encoding. In this example, the data row (106A) stores eight bytes (64 bits) of data. The ECC portion (104A) stores eight bits of parity data. This parity data is generated using a (72, 64, 1) Hamming code or similar encoder. A (72, 64, 1) Hamming code stores eight bits of parity data in addition to sixty-four bits of data, for a codeword length of 72 bits. The (72, 64, 1) Hamming code can detect two errors and correct one error in the codeword during decoding. Certainly, other codes may be used such as a (71, 64, 1) Hamming code or other type of non-Hamming code. Generally, however, the codes utilized in FIG. 1 will likely be single error correction double error detection (SECDED) codes given the speed at which the encoding and decoding must be performed.

During operation, cells in the memory (100) periodically (and unpredictably) lose their values. This effect is referred to as variable retention time (VRT). To compensate for VRT, the memory (100) establishes a VRT profile (112) by monitoring the data rows (102). In one embodiment, the memory (100) monitors the rows during periodic refreshes to detect when errors occur in cells (e.g., cells 108A-108C). The results of this monitoring are stored in VRT profile (112) which comprises a 1×N array, where N is the number of rows (102) in memory (100). The entries in the VRT profile (112) correspond to a VRT severity level of the memory. This severity level is proportionate to the refresh frequency applied to the rows.

For example, by default, all rows are assigned a severity of zero (0). Thus, by default all rows will be refreshed at a predefined base frequency. During operation, the memory detects that cell (108A), cell (108B), and cell (108C) have severity levels of one, two, and three, respectively. The memory updates the VRT profile (112) correspondingly at locations (114A-114C). These VRT profile (112) entries are used to dynamically adjust when each row is refreshed. For example, each row marked as zero in the VRT profile (112) may be refreshed at a rate of 3 Hz while rows with severity levels (114A-114C) may be refreshed at a rate of 4, 5, and 6 Hz, respectively. The specific refresh rates are not intended to be limiting.

Figure 2:
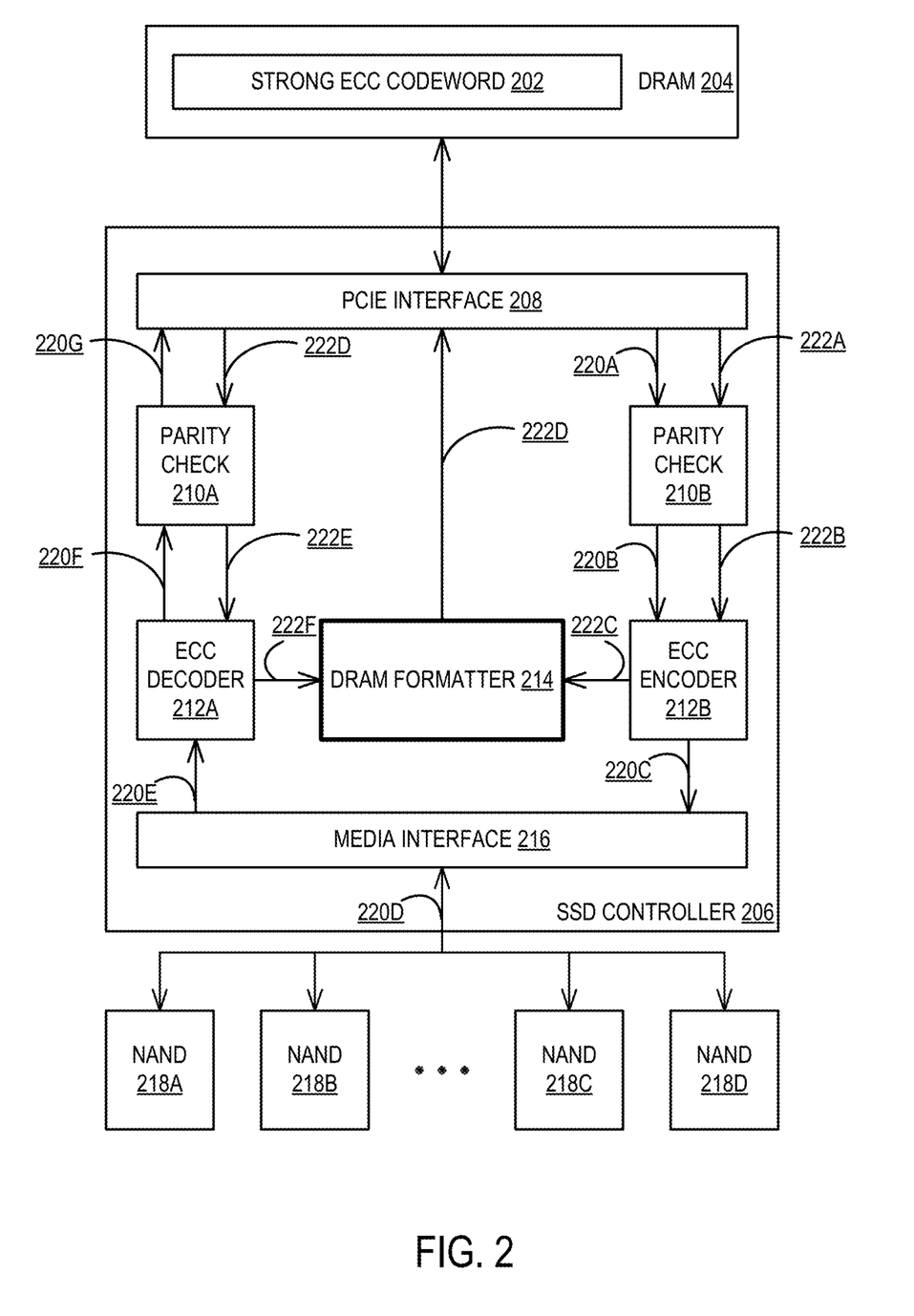
FIG. 2 is a block diagram illustrating a system for providing error-correcting code-assisted scrubbing according to some embodiments of the disclosure.

FIG. 2 is a block diagram illustrating a system for providing error-correcting code-assisted scrubbing according to some embodiments of the disclosure.

The system includes a DRAM (204). DRAM (204) may comprise a dual in-line memory module (DIMM) package or any other type of packaging. DRAM (204) includes at least on strong ECC codeword (202) and, more commonly, many codewords. Details of the format of codeword (202) are described more fully in connection with FIG. 3, the disclosure of which is incorporated herein by reference in its entirety.

DRAM (204) is connected to a solid state drive (SSD) controller (206) via a peripheral component interconnect express (PCIe) bus. In one embodiment, data transmitted between controller (206) and DRAM (204) is mediated by a host device central processing unit (CPU). More commonly, controller (206) accesses DRAM (204) directly via direct memory access (DMA). In one embodiment, controller (206) issues requests to DRAM (204) via a bus arbitration protocol which governs access to memory. Controller (206) issues such requests via PCIe interface (208).

Controller (206) includes various components for processing data received over PCIe interface (208) including parity check modules (210A, 210B), ECC encoder/decoder (212B, 212C), DRAM formatter (214), and media interface (216). In the illustrated embodiment, controller (206) receives commands affecting data stored DRAM (204) as well as data stored in NAND devices (218A-218D). That is, controller (206) may be included as part of a NAND-based storage device (e.g., a storage device) and thus performs standard storage device operations as well as the described DRAM assistance operations.

In the illustrated embodiment, the data path (220A-220G) indicates the flow of data during routine SSD operations.

For an operation writing to the SSD storage medium, a command is received via PCIe interface (208). This write operation is transmitted (220A) to parity check module (210B) which generates one or more parity bits for the received data to write to NAND Flash (218A-218D). The combined codeword is then transmitted (220B) to ECC encoder (212B) which encodes the codeword using a predefined encoding scheme such as a Hamming code or Bose-Chaudhuri-Hocquenghem (BCH) code. The encoded codeword is then transmitted (220C) to media interface (216). The media interface (216) comprises an interface to convert commands received via PCIe interface (208) to commands understandable by the underlying storage media (218A-218D).

For an operation reading from the SSD storage medium, a command is received via PCIe interface (208). The underlying data is retrieved from the NAND devices (218A-218D) and transmitted (220D) to the media interface (216). The media interface (216) transmits (220E) the data to the ECC decoder (212A). In one embodiment, the ECC decoder (212) may comprise a low-density parity check (LDPC) decoder which detects and corrects any errors based on the encoding scheme used by ECC encoder (212B). After decoding the data, the ECC decoder (212A) transmits (220F) the decoded data to parity check module (210A) which checks the parity bits of the decoded data. Finally, upon confirming the parity, the parity check module (210A) returns (220G) the data to the requesting device via PCIe interface (208).

In contrast to a standard SSD data path, the illustrated embodiment provides an SSD-assisted DRAM scrubbing datapath (222A-222F). In the illustrated embodiment, when processing reads from DRAM (204), the DRAM (204) data is received via PCIe interface (208) on data path (222D). The parity check module (210A) runs a parity check on the memory data and, if the parity check passes, may simply return the data to the reader application requesting the memory data. Alternatively, if the parity check fails, the parity check module (210A) transmits (222E) the error-containing data to the ECC decoder (212A). The ECC decoder (212A) performs decoding on the memory data and may return the decoded data back to the reader application. Alternatively, or in conjunction with the foregoing, the ECC decoder (212A) is configured to transmit the decoded memory data back to memory via DRAM formatter (214). In one embodiment, DRAM formatter (214) is configured to receive corrected data from decoder/encoder (212A, 212B) and re-align the data according to predefined schema (described in FIG. 3). DRAM formatter (214) transmits (222D) the aligned codewords to DRAM (204) via PCIe interface (208).

During a memory write operation, the controller (206) receives the command via PCIe interface (208) and transmits (222A) the data to be written to parity check module (210B) which generates the parity extension for the data to be written. The parity check module (210B) then transmits (222B) the parity-encoded data to ECC encoder (212B) which executes the strong ECC encoding (e.g., BCH, etc.) on the parity-including codeword. The ECC encoder (212B) transmits (222C) the encoded data to the DRAM formatter (214) which realigns the data (as discussed above) and transmits (222D) the data to DRAM (204). Descriptions of the alignment of DRAM formatter (214) are described in more detail in the description of FIG. 3, which is incorporated by reference in its entirety. Descriptions of the above operations are described in more detail in connection with FIGS. 5A, 5B, and 5C, the description of which is incorporated herein by reference in its entirety.

Figure 3:
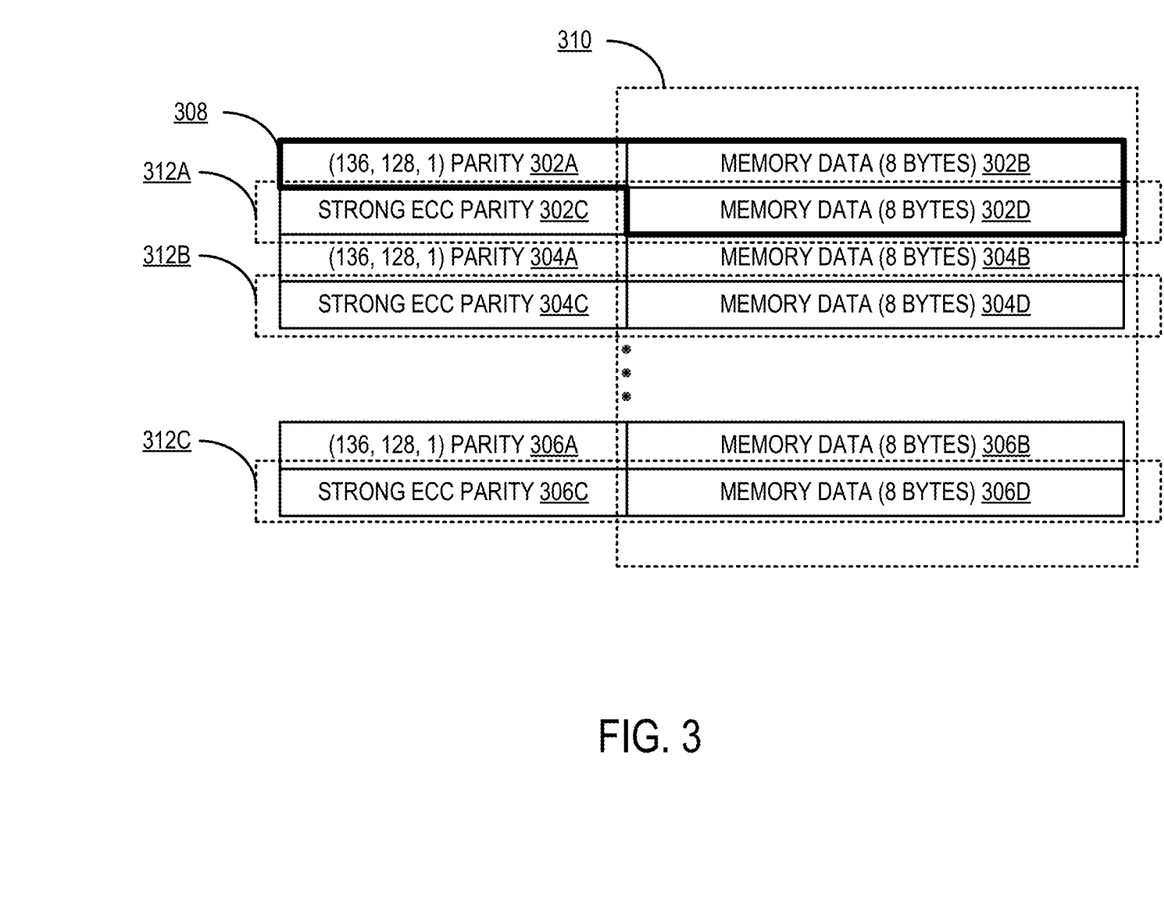
FIG. 3 is a diagram illustrating a data alignment scheme according to some embodiments of the disclosure.

FIG. 3 is a diagram illustrating a data alignment scheme according to some embodiments of the disclosure.

In the illustrated embodiment, data (310) is stored within rows (e.g., 308) of memory. In the illustrated embodiment, two rows of memory data (e.g., 302B, 302D) are used as the minimum read/write datagram. That is, in traditional systems, individual rows of memory may be read/written during refresh/scrubbing while in the current systems multiple rows are affected by refresh and writing.

Using the upper two rows (storing memory data 302B, 302D) as an example, the memory data (302B, 302D) comprises 128 bits of memory data. In the illustrated embodiment, the parity extensions for each of the two rows are used to store error correction data in contrast to a single parity extension per row as illustrated in FIG. 1. In the illustrated embodiment, a (136, 128, 1) code is used to generate the parity extension data for memory data (302B, 302B). In a (136, 128, 1) code, eight bits of parity data are stored within parity extension (302A). In one embodiment, parity extension (302A) and memory data (302B, 302D) may comprise the only data necessary to read data from memory in the event that one or no errors are detected in the data (e.g., 302B, 302D). Although illustrated as using a (136, 128, 1) code, other codes may be used and the particular code used is not intended to be limiting.

As illustrated, each couplet of memory data (e.g., 302B, 302D) includes strong ECC parity data (e.g., 302C) included in the final row of the couplet. As described above, the strong ECC parity data comprises a BCH or similar strongly correctable error correcting parity extension. In general, the strong ECC parity may be generated by an encoding device present in an SSD controller and generally represents a parity extension that may be used to correct multiple errors in the couplet.

As described in connection with FIG. 2, a DRAM formatter aligns data in the format illustrated in FIG. 3. In some embodiments, the DRAM formatter receives the memory data, parity extension, and strong ECC encoding. In some embodiments, these portions may be out of order or otherwise ill formatted for writing to memory. In the illustrated embodiment, DRAM formatter primarily reorganizes the encoded data into the format illustrated in FIG. 3 using the outputs of the parity check generator and ECC encoder.

Figure 4:
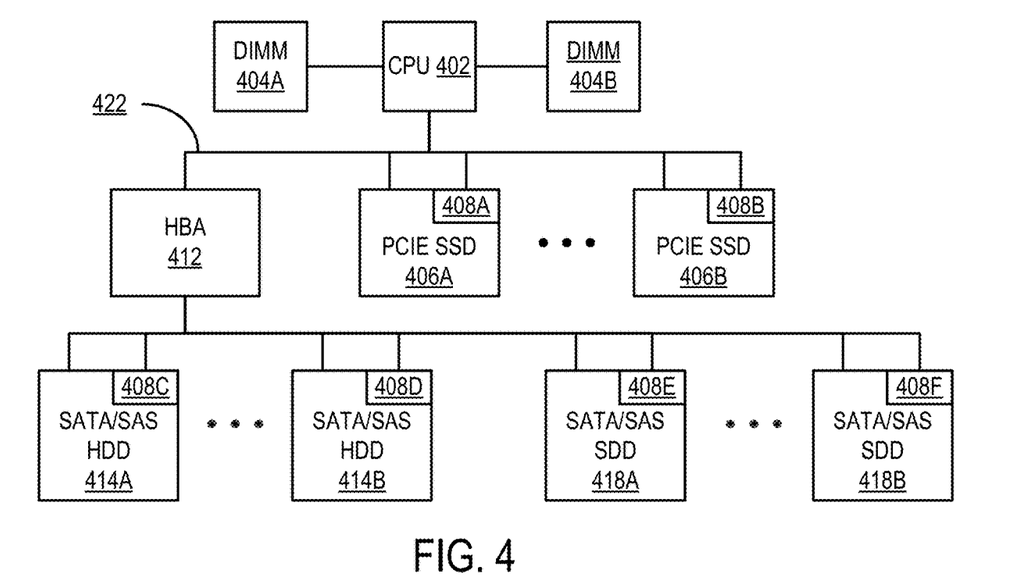
FIG. 4 is a block diagram of a computing system for providing error-correcting code-assisted scrubbing according to some embodiments of the disclosure.

FIG. 4 is a block diagram of a computing system for providing error-correcting code-assisted scrubbing according to some embodiments of the disclosure.

In the illustrated embodiment, CPU (402) accesses DRAM DIMMs (404A, 404B) via a dedicated memory interface, as known in the art. CPU (402) is communicatively coupled to various devices (412, 406A, 406B) via a bus (422), such as a PCIe bus. In one embodiment, host bus adapter (HBA) (412) comprises a PCIe expansion card that enables non-PCIe devices to communicate via PCIe bus (422). In the illustrated embodiment, HBA (412) connects SATA/SAS HDD devices (414A, 414B) and SSD devices (418A, 418B) to the CPU (402) via the HBA (412). In one embodiment, the devices (414A, 414B, 418A, 418B) may operate over a second bus different from the bus (420) (e.g., a non-PCIe bus).

As illustrated, each device includes a controller (408A-408F) or similar circuitry. In some embodiments, controllers (408A-408F) may comprise the ECC encoder embedded within the respective devices. In other embodiments, controllers (408A-408F) may comprise the microprocessor and/or firmware embedded within the devices. In one embodiment, controllers (408A-408F) are communicatively coupled to CPU (402) via bus (422). In one embodiment, controllers (408A-408F) expose an interface such as a PCIe interface to allow for bidirectional communication. Alternatively, or in conjunction with the foregoing, controllers (408A-408F) may be communicatively coupled to DRAMS (404A, 404B). Although illustrated as a separate interface to bus (422), the controllers (408A-408F) may communicate on a single interface provided for the devices.

Figure 5A:
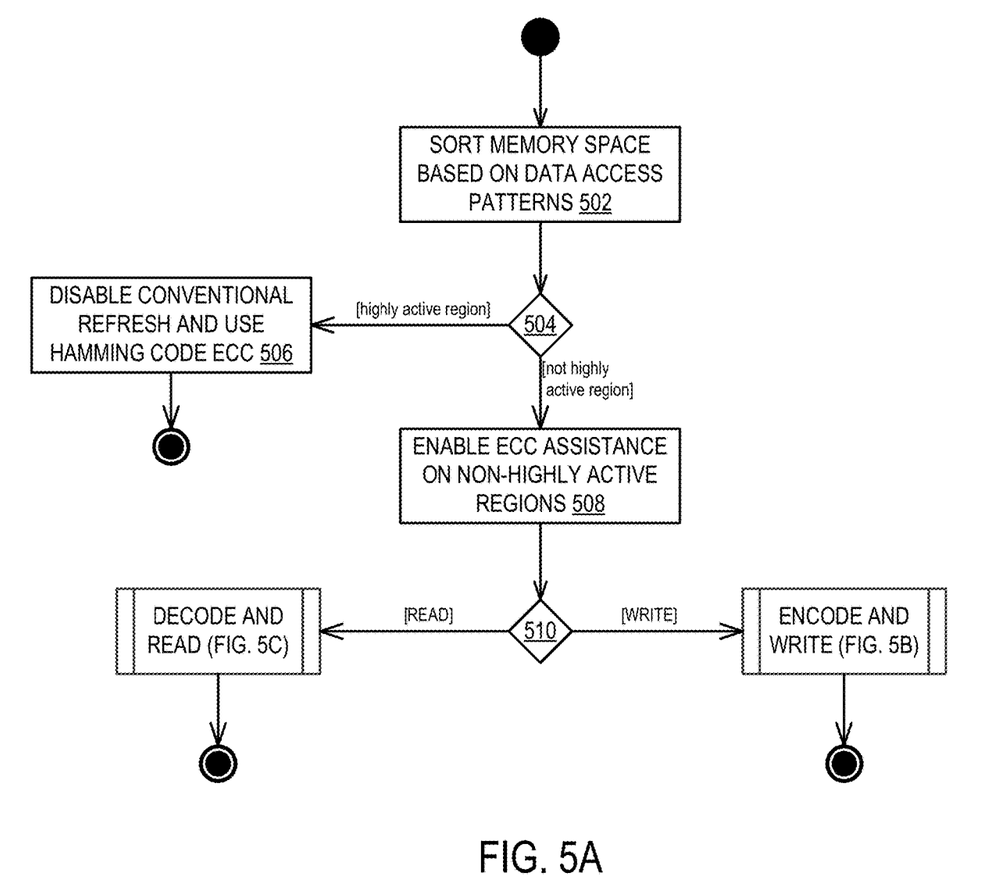
FIG. 5A is a flow diagram illustrating a method for invoking ECC assistance on a memory device using a storage device according to some embodiments of the disclosure.
Figure 5B:
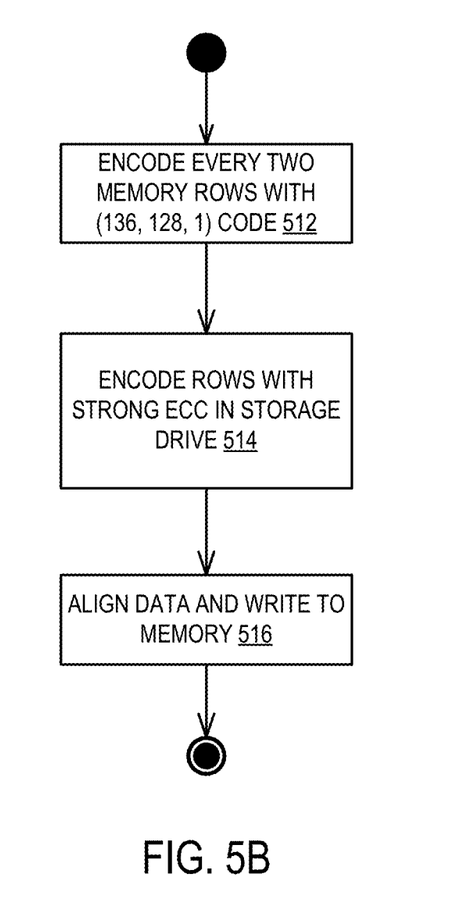
FIG. 5B is a flow diagram illustrating a method for writing data to memory using ECC assistance according to some embodiments of the disclosure.
Figure 5C:
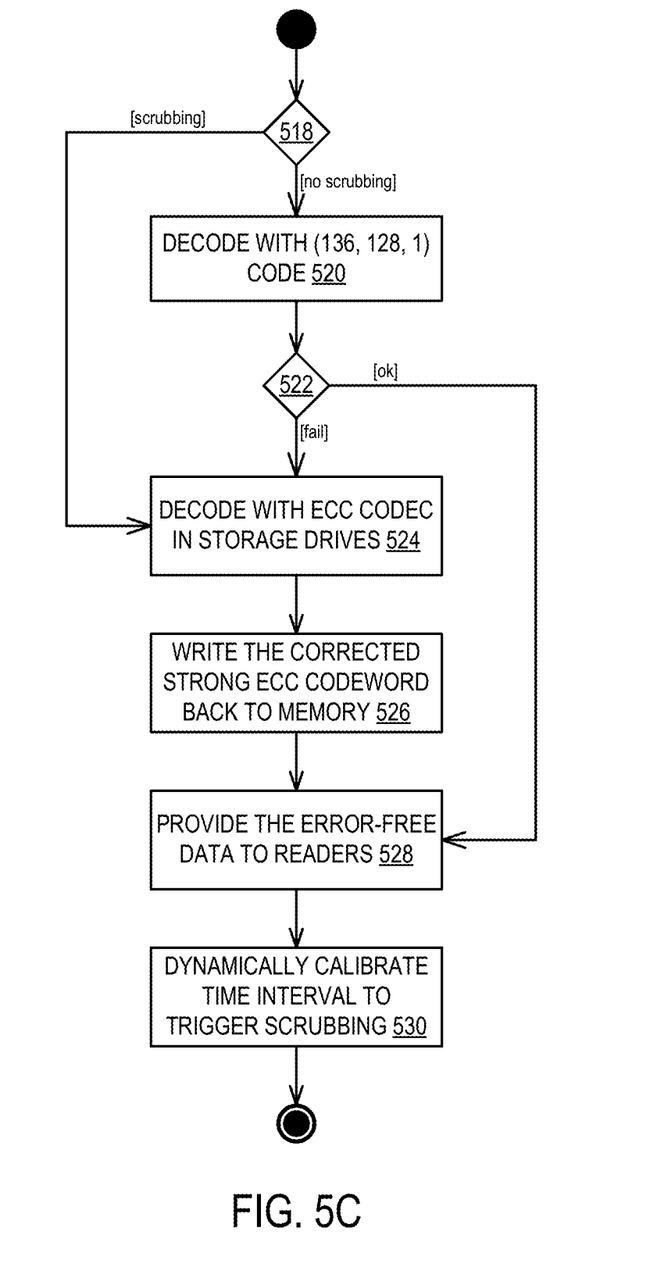
FIG. 5C is a flow diagram illustrating a method for reading data from memory using ECC assistance according to some embodiments of the disclosure.

In the illustrated embodiment, controllers (408A-408F) are responsible for performing encoding and decoding operations as well as scrubbing, as described more fully in connection with FIGS. 5A-5C, the description of which is incorporated herein by reference in its entirety and is not repeated herein. In one embodiment, controllers (408A-408F) perform encoding and decoding when the ECC codecs in the respective devices are idles. In this manner, some, all or none of the controllers (408A-408F) may be active at any given moment. Additionally, the controllers (408A-408F) may, at any moment, be performing either encoding, decoding or scrubbing. That is, the controllers (408A-408F) operate autonomously and asynchronously.

FIG. 5A is a flow diagram illustrating a method for invoking ECC assistance on a memory device using a storage device according to some embodiments of the disclosure.

In step 502, the method sorts a memory space based on data access patterns.

In the illustrated embodiment, access patterns to memory (e.g., DRAM) may be monitored by either the memory itself, a CPU, or by a storage device. In general, an access pattern refers to how frequently (or infrequently) a given area of memory (e.g., a row) is accessed (e.g., read or written). In one embodiment, the method retrieves this data (which may be stored by the memory) and sorts the memory locations based on the frequency of access. In one embodiment, the memory space may be segmented according to a predefined segmenting interval. This segmenting interval may comprise a row of memory space or a group of rows, the particular interval not limited by the disclosure.

In step 504, the method accesses the sorted memory space and iterates though the space identifying whether a given segment of the memory space is either highly active or not highly active. In one embodiment, a highly active region comprises a region wherein accesses (reads or writes) exceed a predefined threshold, the threshold not limiting the disclosure.

In step 506, the method disables conventional refresh implemented by the memory device and uses the memory device's Hamming code ECC to decode or encode the data for reads or writes, respectively. In the illustrated embodiment, if the memory region is highly active, the method bypasses more intensive processing due the delay incurred by the processing and additionally due to the fact that a highly active region of memory is less like to be subject to VRT.

In step 508, the method enables ECC assistance on any region identified as not highly active. In one embodiment, enabling ECC assistance may comprise raising a flag that triggers the read/write processes discussed in FIGS. 5B and 5C for any reads or writes affecting those regions. In one embodiment, the method may then pause and wait for a memory read or write (in step 510).

In response to a read or write, the method executes the routines described more fully in connection with FIGS. 5C and 5B, respectively, which are described more fully herein.

FIG. 5B is a flow diagram illustrating a method for writing data to memory using ECC assistance according to some embodiments of the disclosure.

In the illustrated embodiment, the method may be executed by a solid-state device and, specifically, by a controller of such a device. In some embodiments, the method may be executed prior to each write to memory. In other embodiments, the method may only be executed selectively. For example, the method may only be executed when writing to a region of memory that is not highly active.

In step 512, the method encodes every two memory rows in a region with a first encoding, e.g., a (136, 128, 1) Hamming code.

In one embodiment, the method may first receive data to be written to memory. In some embodiments, this data may comprise an entire row (or multiple rows) or memory. Alternatively, or in conjunction with the foregoing, the data may comprise a piece of data that spans multiple rows and is not cleanly aligned with the row boundaries. Prior to step 512, the method may retrieve the range of rows that will contain the data. For example, the method may compute the floor and ceiling of the addresses surrounding the start and end address of the data to be written. In some embodiments, the method retrieves a minimum of two rows. In some embodiments, the method may execute the method described in FIG. 5C when reading data from memory prior to step 512.

As illustrated, the method iterates through each pair of rows and encodes the row-pair using a first encoding. In the illustrated embodiment, the first encoding comprises a (136, 128, 1) Hamming code. The specific encoding may be chosen based on the length of the row and the available space for parity bits. In the illustrated embodiment, the first encoding generates a first parity portion (e.g., eight bits when using a (136, 128, 1) Hamming code).

In one embodiment, the encoding the rows using a first encoding may be performed by a storage device. However, in other embodiments, a dedicated encoder on the memory device (e.g., DIMM package) may perform the first encoding.

In step 514, the method encodes the rows using an ECC encoder located in a storage device.

In one embodiment, the method uses the data in the memory rows used to generate the parity portion as the codeword for ECC encoding. That is, the ECC encoder uses the raw input data as the codeword (versus the codeword and the parity bits). In one embodiment, the ECC encoding thus comprises a second encoding which may comprise a second Hamming code, BCH code, or other strong error correcting code (e.g., a polynomial-based code, forward error correction (FEC) code, etc.). In general, the method may utilize the existing ECC encoder installed or used within a storage device to provide the ECC encoding.

In step 516, the method aligns the data and writes the aligned data to memory. In the illustrated embodiment, after twice-encoding the data to be written, two parity extensions are generated. A first parity portion is generated using the weak Hamming code (step 512) and a second parity portion is generated using the strong ECC code (step 514). The method additionally has the underlying data (i.e., codeword) used to generate the parity portions. In step 516, the method concatenates and arranges the data according to a defined scheme. For example, the method may segment the codeword into two equal sized portions, the size based on the length of data in a given memory row. The method may then prepend the first parity portion to one portion of the codeword and prepend the second parity portion to the remaining portion of the codeword. The method may then generate the memory addresses to write the data based on the original memory locations of the data (accounting for any run-off in insertions). Finally, using the updated memory addresses and the aligned codeword/parity combinations, the method writes this data back to memory.

FIG. 5C is a flow diagram illustrating a method for reading data from memory using ECC assistance according to some embodiments of the disclosure.

In step 518, the method first determines whether a scrubbing operation is being performed.

As described above, a memory device may periodically scrub memory regions according to pre-scheduled time interval. In one embodiment, the time interval may be dynamically calibrated based on the error correction procedure performed in steps 524-528 (described below). If a scrubbing mode is enabled, the method bypasses steps 520 and 522. If scrubbing is not enabled, the method proceeds to step 520.

In step 520, the method decodes data with a first encoding, such as a (136, 128, 1) Hamming code.

In one embodiment, the data decoded in step 520 comprises a set of rows resident in memory. For example, the method may decode two rows of memory in a given memory region. In some embodiments, the method may be re-executed for multiple row-pairs in a given region of memory. In the illustrated embodiment, a (136, 128, 1) Hamming code is used to decode the memory rows.

In step 522, the method determines if the decoding in step 520 succeeds.

In one embodiment, the data processed in step 520 includes a parity portion generated using the first encoding. In step 522, the method uses this parity portion to determine if the codeword does or does not contain any errors. That is, the method computes the parity of the actual data and confirms whether the parities match. In one embodiment, steps 520 and 522 may be performed at a storage device while in other embodiments the steps may be performed by a memory package (e.g., DIMM package).

If the method determines that the decoding using the first decoding is successful, the method provides the error-free data to reader applications in step 528. In the illustrated embodiment, if the data is decoded and verified using the weak first encoding (e.g., (136, 128, 1) Hamming code), the method determines that stronger decoding is not detected. In some embodiments, the method may proceed to step 528 if the method can correct an error (or errors) using the weaker encoding. In general, the method may bypass stronger decoding whenever possible to avoid the latency involved in stronger error correction.

In some embodiments however, the data may not be correctable using a weaker encoding scheme. In this embodiment, the decoding in step 520 fails and the method proceeds to step 524.

In step 524, the method decodes the rows using an ECC codec in a storage device. In one embodiment, the memory device transmits the rows of memory data to a storage device over a bus such as a PCIe bus. In one embodiment, a controller of a storage device (or other peripheral) receives the memory rows over the PCIe bus. As described above, these memory rows include errors uncorrectable using the memory's internal decoder and thus, in prior systems, would comprise uncorrectable errors.

In the illustrated embodiment, the method decodes the rows using the ECC codec in the storage drive. This ECC codec may comprise an LDPC codec or similar codec for decoding data. In the illustrated embodiment, the method utilizes an existing ECC codec resident on the storage device (or other peripheral). Thus, any ECC codec employed may be used in step 524.

In one embodiment, the method parses the memory data to extract a parity portion to converge upon during decoding. As described in FIG. 3, a dedicated portion of a row couplet may be assigned as the strong ECC parity portion. In step 524, the method identifies the location of this portion and uses the portion to decode the codeword. In some embodiments, the method utilizes a soft decoder to ensure quick and accurate decoding of the codeword.

In one embodiment, the method may additionally flag the rows received in step 524 as containing errors. In one embodiment, the method maintains a table of memory addresses and a profile of timing for scrubbing these locations. Initially the table may default to a preset scrubbing interval. As errors are detected, this scrubbing interval is modified based on the time delta between the current error and the last error. For example, if the current error occurred prior to the time interval stored in the table, the method may decrease the time interval, resulting in more frequent scrubbing. In some embodiments, the initial values of the table may be null and the first time an error occurs, the method may set the interval based on a delta between a manufacture date and the current time, thus converging upon an average time delta.

In step 526, the method writes the corrected strong ECC codeword back to memory. In one embodiment, the method first aligns the data and writes the aligned data to memory. In one embodiment, writing the data may comprise writing the corrected codeword as well as updated parity portions to memory as described in more detail in FIG. 5B.

After step 526 (or concurrently with), the method provides the error-free data to reader applications. In one embodiment, the method returns the data to memory and the memory provides the data to reader applications. In other embodiments, the method returns the data to reader applications over a PCIe bus directly to the CPU or to a DMA-mapped device.

In step 528, the method dynamically calibrates the time interval to trigger scrubbing. As described above, the method uses the strong error correction step (step 524) as an indicator of how often an uncorrectable error occurs. In step 528, the method uses this table of time intervals to inform the memory how often the memory should be scrubbed to avoid such errors. In step 528, the method transmits the time interval data back to memory which stores the scrubbing intervals for triggering scrubbing (step 518).

Figure 6:
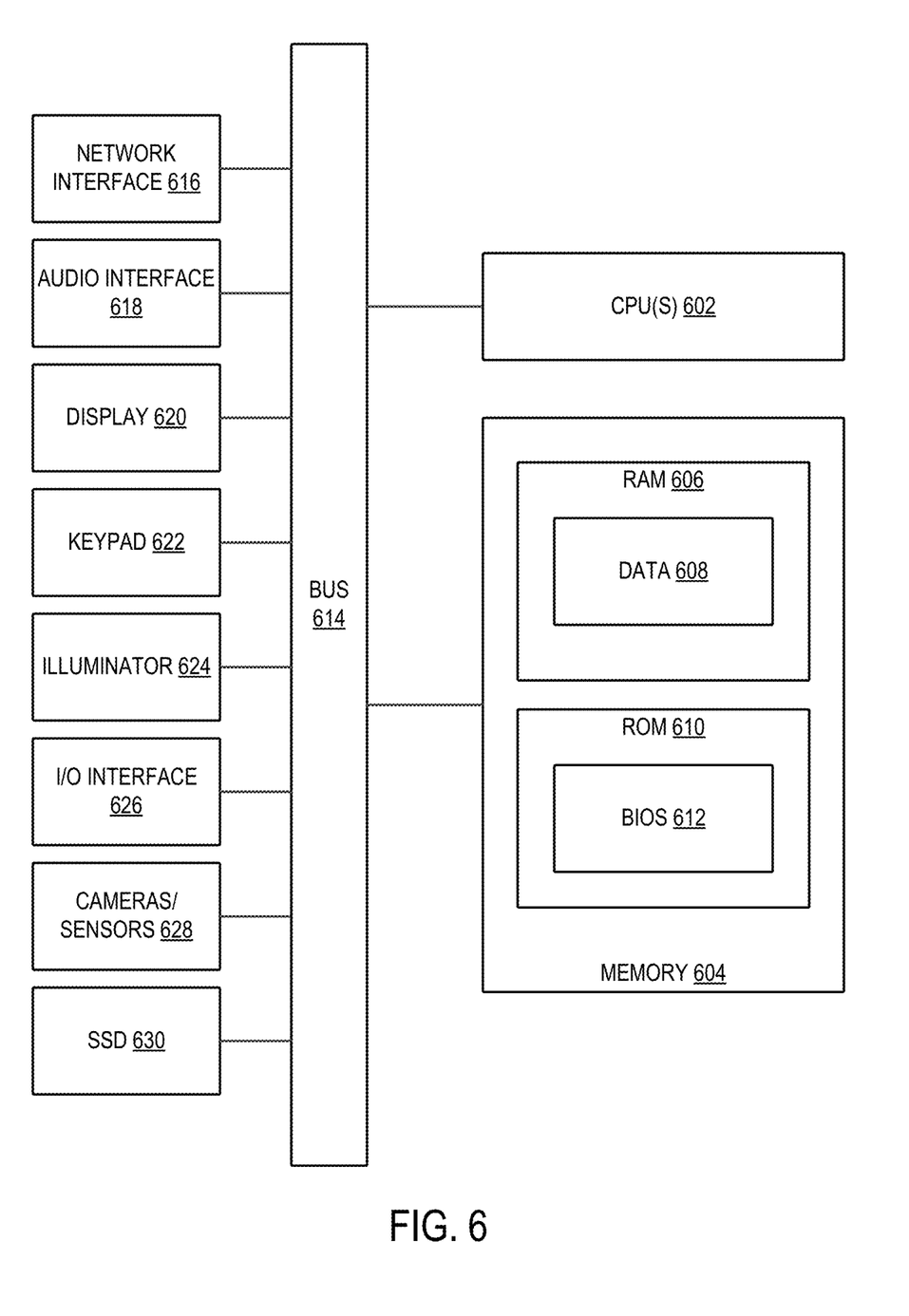
FIG. 6 is a flow diagram illustrating a computing system for providing ECC assistance according to some embodiments of the disclosure.

FIG. 6 is a flow diagram illustrating a computing system for providing ECC assistance according to some embodiments of the disclosure.

Client device may include many more or fewer components than those shown in FIG. 6. However, the components shown are sufficient to disclose an illustrative embodiment for implementing the present disclosure.

As shown in FIG. 6, client device includes processing units (CPUs) (602) in communication with a mass memory (604) via a bus (614). Client device also includes one or more network interfaces (616), an audio interface (618), a display (620), a keypad (622), an illuminator (624), an input/output interface (626), and a camera(s) or other optical, thermal or electromagnetic sensors (628). Client device can include one camera/sensor (628), or a plurality of cameras/sensors (628), as understood by those of skill in the art.

Client device may optionally communicate with a base station (not shown), or directly with another computing device. Network interface (616) includes circuitry for coupling client device to one or more networks and is constructed for use with one or more communication protocols and technologies. Network interface (616) is sometimes known as a transceiver, transceiving device, or network interface card (NIC).

Audio interface (618) is arranged to produce and receive audio signals such as the sound of a human voice. For example, audio interface (618) may be coupled to a speaker and microphone (not shown) to enable telecommunication with others and generate an audio acknowledgment for some action. Display (620) may be a liquid crystal display (LCD), gas plasma, light emitting diode (LED), or any other type of display used with a computing device. Display (620) may also include a touch sensitive screen arranged to receive input from an object such as a stylus or a digit from a human hand.

Keypad (622) may comprise any input device arranged to receive input from a user. For example, keypad (622) may include a push button numeric dial, or a keyboard. Keypad (622) may also include command buttons that are associated with selecting and sending images. Illuminator (624) may provide a status indication and provide light. Illuminator (624) may remain active for specific periods of time or in response to events. For example, when illuminator (624) is active, it may backlight the buttons on keypad (622) and stay on while the client device is powered. Also, illuminator (624) may backlight these buttons in various patterns when actions are performed, such as dialing another client device. Illuminator (624) may also cause light sources positioned within a transparent or translucent case of the client device to illuminate in response to actions.

Client device also comprises input/output interface (626) for communicating with external devices not shown in FIG. 6. Input/output interface (626) can utilize one or more communication technologies, such as USB, infrared, Bluetooth™, or the like.

Mass memory (604) includes a RAM (606), a ROM (610), and other storage means. Mass memory (604) illustrates another example of computer storage media for storage of information such as computer-readable instructions, data structures, program modules or other data. Mass memory (604) stores a basic input/output system ("BIOS") (612) for controlling low-level operation of client device. The mass memory may also store an operating system for controlling the operation of client device. It will be appreciated that this component may include a general-purpose operating system such as a version of UNIX, or LINUX™, or a specialized client communication operating system such as Windows Client™, or the Symbian® operating system. The operating system may include, or interface with a Java virtual machine module that enables control of hardware components and operating system operations via Java application programs.

Memory (604) includes data (608). As discussed above, data (608) may be formatted according to a pre-defined alignment scheme (as illustrated in FIG. 3, the description of which is incorporated herein by reference in its entirety. The system additionally includes a solid-state drive (630). As discussed in FIG. 4, solid-state drive (630) may comprise a variety of alternative devices. However, such alternative devices should include a controller or other ECC encoder. In the illustrated embodiment, solid-state drive (630) is configured to perform the operations described above including as described in FIGS. 5A-5C, which are incorporated herein by reference in their entirety.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example in order to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method comprising:
obtaining, at a storage device, data and a first parity portion to write to a memory device, the first parity portion generated via a first encoding;
encoding, at the storage device, the data with a second encoding to generate a second parity portion;
aligning, by the storage device, the data, the first parity portion, and the second parity portion according to a predefined alignment scheme, the aligning generating aligned data, the alignment scheme aligning the data into a first and second row, the first row including the first parity portion and a first segment of the data and the second row including the second parity portion and a second segment of the data; and
writing, by the storage device, the aligned data to the memory device.

2. The method of claim 1, further comprising encoding, at the storage device, raw data using the first encoding to generate the first parity portion.

3. The method of claim 2, the encoding the data using a first encoding comprising encoding the data using a Hamming code.

4. The method of claim 1, the aligning the data, the first parity portion, and the second parity portion further comprising prepending the first parity portion to the first segment and prepending the second parity portion to the second segment.

5. A method comprising:
decoding, by a storage device from a memory, a memory region using a first decoding in response to a read command, the memory region comprising at least two rows of memory, the first decoding comprising using a first parity portion stored in a first row of the memory region to decode the memory region;
detecting, by the storage device, that the decoding using the first decoding failed;
decoding, by the storage device, the memory region using a second decoding to generate a codeword, the second decoding comprising using a second parity portion stored in a second row of the memory region to decode the memory region;
writing, by the storage device, the codeword to the memory; and
returning, by the storage device, the codeword to a device that issued the read command.

6. The method of claim 5, further comprising bypassing, by the storage device, the decoding of the memory region using the first decoding if a scrubbing mode is enabled.

7. The method of claim 5, further comprising bypassing, by the storage device, the decoding using the second decoding and the writing the codeword to memory if the decoding using the first decoding does not fail.

8. The method of claim 5, further comprising dynamically calibrating, by the storage device, a time interval to trigger a scrubbing mode after returning the codeword.

9. A device comprising:
a processor; and
a storage medium for tangibly storing thereon program logic for execution by the processor, the stored program logic comprising:

logic, executed by the processor, for obtaining data and a first parity portion to write to a memory device, the first parity portion generated via a first encoding, encoding the data with a second encoding to generate a second parity portion, aligning the data, the first parity portion, and the second parity portion according to a predefined alignment scheme, the aligning generating aligned data, the alignment scheme aligning the data into a first and second row, the first row including the first parity portion and a first segment of the data and the second row including the second parity portion and a second segment of the data, and writing the aligned data to the memory device.

10. The device of claim 9, the stored program logic further comprising logic, executed by the processor, for encoding, at the storage device, raw data using the first encoding to generate the first parity portion.

11. The device of claim 10, the logic for encoding the data using a first encoding comprising logic, executed by the processor, for encoding the data using a Hamming code.

12. The device of claim 9, the logic for aligning the data, the first parity portion, and the second parity portion further comprising logic, executed by the processor, for prepending the first parity portion to the first segment and prepending the second parity portion to the second segment.

13. A device comprising:

a processor; and a storage medium for tangibly storing thereon program logic for execution by the processor, the stored program logic comprising:

logic, executed by the processor, for decoding, from a memory, a memory region using a first decoding in response to a read command, the memory region comprising at least two rows of memory, the first decoding comprising using a first parity portion stored in a first row of the memory region to decode the memory region, logic, executed by the processor, for detecting that the decoding using the first decoding failed, logic, executed by the processor, for decoding the memory region using a second decoding to generate a codeword, the second decoding comprising using a second parity portion stored in a second row of the memory region to decode the memory region, logic, executed by the processor, for writing the codeword to the memory, and logic, executed by the processor, for returning the codeword to a device that issued the read command.

14. The device of claim 13, the stored program logic further comprising logic, executed by the processor, for bypassing, by the storage device, the decoding of the memory region using the first decoding if a scrubbing mode is enabled.

15. The device of claim 13, the stored program logic further comprising logic, executed by the processor, for bypassing, by the storage device, the decoding using the second decoding and the writing the codeword to memory if the decoding using the first decoding does not fail.

16. The device of claim 13, the stored program logic further comprising logic, executed by the processor, for dynamically calibrating, by the storage device, a time interval to trigger a scrubbing mode after returning the codeword.

* * * * *